(12) United States Patent
Anderson et al.

(10) Patent No.: US 11,670,542 B2
(45) Date of Patent: Jun. 6, 2023

(54) STEPPED TOP VIA FOR VIA RESISTANCE REDUCTION

(71) Applicant: International Business Machines Corporation, Armonk, NY (US)

(72) Inventors: Brent Alan Anderson, Jericho, VT (US); Lawrence A. Clevenger, Saratoga Springs, NY (US); Christopher J. Penny, Saratoga Springs, NY (US); Kisik Choi, Watervliet, NY (US); Nicholas Anthony Lanzillo, Wynantskill, NY (US); Robert Robison, Rexford, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/570,445

(22) Filed: Jan. 7, 2022

(65) Prior Publication Data

US 2022/0130718 A1      Apr. 28, 2022

Related U.S. Application Data

(62) Division of application No. 16/787,240, filed on Feb. 11, 2020, now Pat. No. 11,232,977.

(51) Int. Cl.
*H01L 21/768* (2006.01)
*H01L 23/532* (2006.01)
*H01L 23/522* (2006.01)

(52) U.S. Cl.
CPC .. *H01L 21/76802* (2013.01); *H01L 21/76805* (2013.01); *H01L 21/76816* (2013.01);
(Continued)

(58) Field of Classification Search
CPC ......... H01L 21/76802; H01L 21/76805; H01L 21/76816; H01L 21/76829; H01L 21/76882; H01L 23/5226; H01L 23/53295
See application file for complete search history.

(56) References Cited

U.S. PATENT DOCUMENTS

| | | | |
|---|---|---|---|
| 4,943,539 A | * | 7/1990 | Wilson ................ H01L 21/7688 438/970 |
| 5,512,514 A | | 4/1996 | Lee |

(Continued)

OTHER PUBLICATIONS

List of IBM Patents or Patent Applications Treated as Related; Date Filed: Jan. 7, 2022, 2 pages.

*Primary Examiner* — Shahed Ahmed
*Assistant Examiner* — Vicki B. Booker
(74) *Attorney, Agent, or Firm* — Cantor Colburn LLP; Daniel Yeates

(57) ABSTRACT

Embodiments of the present invention are directed to fabrication methods and resulting interconnect structures having stepped top vias that reduce via resistance. In a non-limiting embodiment of the invention, a surface of a conductive line is recessed below a first dielectric layer. A second dielectric layer is formed on the recessed surface and an etch stop layer is formed over the structure. A first cavity is formed that exposes the recessed surface of the conductive line and sidewalls of the second dielectric layer. The first cavity includes a first width between sidewalls of the etch stop layer. The second dielectric layer is removed to define a second cavity having a second width greater than the first width. A stepped top via is formed on the recessed surface of the conductive line. The top via includes a top portion in the first cavity and a bottom portion in the second cavity.

7 Claims, 10 Drawing Sheets

(52) U.S. Cl.
 CPC .. *H01L 21/76829* (2013.01); *H01L 21/76882* (2013.01); *H01L 23/5226* (2013.01); *H01L 23/53295* (2013.01)

(56) References Cited

U.S. PATENT DOCUMENTS

| | | |
|---|---|---|
| 5,693,568 A | 12/1997 | Liu et al. |
| 5,888,309 A | 3/1999 | Yu |
| 6,077,770 A | 6/2000 | Hsu |
| 6,291,334 B1 | 9/2001 | Somekh |
| 6,424,044 B1 | 7/2002 | Han et al. |
| 8,097,949 B2 | 1/2012 | Gosset et al. |
| 9,391,019 B2 | 7/2016 | Kobrinsky et al. |
| 9,613,861 B2 | 4/2017 | Anderson et al. |
| 9,659,864 B2 | 5/2017 | Wu et al. |
| 10,032,643 B2 | 7/2018 | Chawla et al. |
| 2015/0056800 A1 | 2/2015 | Mebarki et al. |
| 2016/0027729 A1* | 1/2016 | Chen .................. H01L 23/5226 438/702 |
| 2016/0276271 A1 | 9/2016 | Chen et al. |
| 2021/0249302 A1 | 8/2021 | Anderson et al. |

* cited by examiner

STEPPED TOP VIA FOR VIA RESISTANCE REDUCTION

CROSS-REFERENCES TO RELATED APPLICATIONS

This application is a divisional application of and claims priority benefit of U.S. patent application Ser. No. 16/787,240, filed Feb. 11, 2020, now U.S. Pat. No. 11,232,977—the entirety of which is incorporated by reference herein and made a part of this specification.

BACKGROUND

The present invention generally relates to fabrication methods and resulting structures for semiconductor devices, and more specifically, to fabrication methods and resulting semiconductor structures having stepped top vias for reduced via resistance.

The fabrication of very large scale integrated (VLSI) or ultra large scale integrated (VLSI) circuits requires the manufacture of sophisticated interconnect structures including metallic wiring that connects individual devices in a semiconductor chip to one another. Typically, the wiring interconnect network includes two types of features that serve as electrical conductors, namely, line features that traverse a distance across the chip, and conductive via features that connect lines in different levels. The conducting metal lines and conductive vias are made of conductive material, such as aluminum or copper, and are electrically insulated by interlayer dielectrics (ILD).

To increase the number of circuits that can be provided on a chip, the semiconductor industry has repeatedly shrunk the transistor gate length and the chip size. As a consequence, the interconnect structure that forms the metallic circuitry has also shrunk. As integrated circuit (IC) feature sizes continue to decrease, the aspect ratio, (i.e., the ratio of height/depth to width) of features such as conductive vias can increase, while spacing tolerances (i.e., feature to feature spacing) decreases, complicating the manufacturing process. Fabricating intricate structures of conductive interconnect layers within increasingly smaller wafer footprints is one of the most process-intensive and cost-sensitive portions of semiconductor IC fabrication.

SUMMARY

Embodiments of the invention are directed to a method for forming stepped top vias that reduce via resistance. A non-limiting example of the method includes recessing a surface of a conductive line below a first dielectric layer. A second dielectric layer is formed on the recessed surface and an etch stop layer is formed over the structure. A first cavity is formed that exposes the recessed surface of the conductive line and sidewalls of the second dielectric layer. The first cavity includes a first width between sidewalls of the etch stop layer. The second dielectric layer is removed to define a second cavity having a second width greater than the first width. A stepped top via is formed on the recessed surface of the conductive line. The top via includes a top portion in the first cavity and a bottom portion in the second cavity.

Embodiments of the invention are directed to a method for forming stepped top vias that reduce via resistance. A non-limiting example of the method includes forming a conductive line in a dielectric layer. The conductive line is recessed and a stepped top via is formed on the recessed surface of the conductive line. The stepped top via includes a top portion having a first width and a bottom portion having a second width. The second width is greater than the first width.

Embodiments of the invention are directed to an integrated circuit. A non-limiting example of the integrated circuit includes a conductive line in a dielectric layer. The integrated circuit further includes a stepped top via on a surface of the conductive line. The stepped top via includes a top portion having a first width and a bottom portion having a second width greater than the first width.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
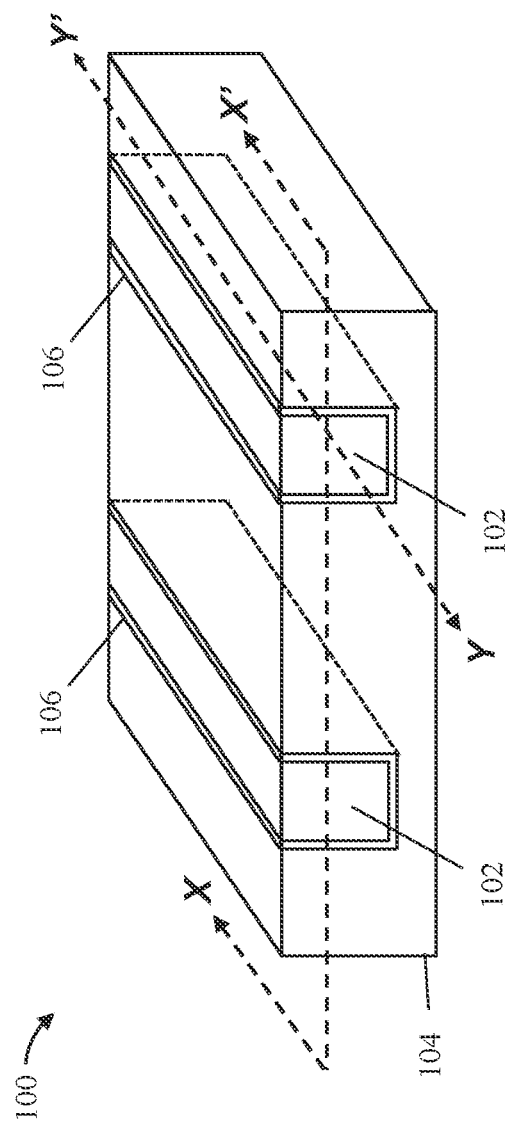
FIG. 1 depicts an isometric view of a semiconductor structure after a processing operation according to one or more embodiments of the invention.

The diagrams depicted herein are illustrative. There can be many variations to the diagrams or the operations described therein without departing from the spirit of the invention. For instance, the actions can be performed in a differing order or actions can be added, deleted or modified.

In the accompanying figures and following detailed description of the described embodiments of the invention, the various elements illustrated in the figures are provided with two or three-digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular transistor architecture, embodiments of the invention are not limited to the particular transistor architectures or materials described in this specification. Rather, embodiments of the present invention are capable of being implemented in conjunction with any other type of transistor architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, ICs are fabricated in a series of stages, including a front-end-of-line (FEOL) stage, a middle-of-line (MOL) stage, and a back-end-of-line (BEOL) stage. The process flows for fabricating modern ICs are often identified based on whether the process flows fall in the FEOL stage, the MOL stage, or the BEOL stage. Generally, the FEOL stage is where device elements (e.g., transistors, capacitors, resistors, etc.) are patterned in the semiconductor substrate/wafer. The FEOL stage processes include wafer preparation, isolation, gate patterning, and the formation of wells, source/drain (S/D) regions, extension junctions, silicide regions, and liners. The MOL stage typically includes process flows for forming the contacts (e.g., CA) and other structures that communicatively couple to active regions (e.g., gate, source, and drain) of the device element. For example, the silicidation of source/drain regions, as well as the deposition of metal contacts, can occur during the MOL stage to connect the elements patterned during the FEOL stage. Layers of interconnections (e.g., metallization layers) are formed above these logical and functional layers during the BEOL stage to complete the IC. Most ICs need more than one layer of wires to form all the necessary connections, and as many as 5-12 layers are added in the BEOL process. The various BEOL layers are interconnected by vias that couple from one layer to another.

Insulating dielectric materials are used throughout the layers of an IC to perform a variety of functions, including stabilizing the IC structure and providing electrical isolation of the IC elements. For example, the metal interconnecting wires in the BEOL region of the IC are isolated by dielectric layers to prevent the wires from creating a short circuit with other metal layers.

The continued scaling of semiconductor devices has resulted in challenging fabrication requirements, especially when fabricating ever smaller metallization layers. Advanced BEOL processes incorporate phase-shifting, optical proximity correction, and other practices to satisfy these scaling demands, and can achieve a line to line pitch below 30 nm. There are challenges, however, in fabricating advanced interconnects having a line to line pitch below 30 nm. For example, via resistances become increasingly pressured by the small contact area between sub-30 nm pitch lines and the corresponding vias. High via resistance degrades overall device performance and achieving lower via resistances is key for the continued scaling of interconnects.

Turning now to an overview of aspects of the present invention, one or more embodiments of the invention address the above-described challenges of the prior art by providing a new semiconductor structure and a method for fabricating top vias having varying width regions configured to reduce via resistances. In multilayered interconnect structures described herein, the metallization layers are referred to as "M" layers (e.g., M1 layer, M2 layer, etc.) while "V" layers denote the conductive vias placed between adjacent M layers (e.g., V1 is between the M1 and M2 layers). As used herein, a "top via" refers to the "V," layer via which electrically couples a line below (an "$M_x$" layer) to a line above (an "$M_{x+1}$" layer). Unlike self-alignment techniques in the prior art, this new method enables the fabrication of top via structures having a top via portion that is narrower than a bottom via portion. In some embodiments of the invention, the via structure is fabricated in a "stepped" configuration by forming a trench recess followed by a dielectric deposition and a lateral etch in the via region to enlarge the contact area at the bottom of the top via without affecting the profile of the top of the via.

The via resistance in a stepped top via formed in the above-described manner is reduced due to the wider lower section that is in direct contact with the line below. Additionally, allowing the stepped top via to maintain a relatively narrower top profile (i.e., reduced width with respect to the bottom portion) mitigates via-to-adjacent line shorts. Advantageously, the introduced lateral etch is self-aligned to the via trench sidewall and no additional masking modules are required.

Turning now to a more detailed description of aspects of the present invention, FIG. 1 depicts an isometric view of an interconnect structure 100 after an initial set of fabrication operations according to one or more embodiments of the invention. In FIG. 1, known fabrication operations have been used to form the interconnect structure 100 such that it includes a conductive line 102 in a dielectric layer 104. In some embodiments of the invention, a liner 106 is positioned between the conductive line 102 and the dielectric layer 104. While not shown for ease of discussion, the conductive line 102 can be one of many lines in a metallization layer of the interconnect structure 100. Moreover, it is understood that the processes described herein, although focusing on the conductive line 102 for ease of discussion, can be used to create metal interconnects having stepped top vias in any metallization layer.

In some embodiments of the invention, the conductive line 102 includes a conductive material formed or deposited in a trench in the dielectric layer 104 using known back-end-of-line (BEOL) processes. In some embodiments of the invention, the conductive line 102 is overfilled above a surface of the trench (not shown), forming overburdens that can be removed using, for example, a chemical-mechanical planarization (CMP) process. The conductive line 102 can be made of any suitable conducting material, such as, for example, metal (e.g., tungsten, titanium, tantalum, ruthenium, zirconium, cobalt, copper, aluminum, platinum), alloys thereof (such as AlCu, CuMn, CuTi, or the like), conducting metallic compound material (e.g., tantalum nitride, titanium nitride, tantalum carbide, titanium carbide, titanium aluminum carbide, tungsten silicide, tungsten nitride, cobalt silicide, nickel silicide), conductive carbon, or any suitable combination of these materials. In some embodiments of the invention, the conductive line 102 is a copper line (copper interconnect). The conductive line 102 can be formed or deposited using, for example, CVD, PECVD, PVD, sputtering, plating, chemical solution deposition, and electroless plating.

In some embodiments of the invention, the dielectric layer 104 is an interlayer dielectric. The dielectric layer 104 serves as an isolation structure for the lines and vias of the interconnect structure 100. The dielectric layer 104 can be made of any suitable dielectric material, such as, for example, low-k dielectrics (materials having a small dielectric constant relative to silicon dioxide, i.e., less than about 3.9), ultra-low-k dielectrics (materials having a dielectric constant less than 3.0), porous silicates, carbon doped oxides, silicon dioxides, silicon nitrides, silicon oxynitrides, silicon carbide (SiC), or other dielectric materials. Any known manner of forming the dielectric layer 104 can be utilized, such as, for example, CVD, PECVD, ALD, flowable CVD, spin-on dielectrics, or PVD.

In some embodiments of the invention, the liner 106 can be formed between the conductive line 102 and the dielectric layer 104. The liner 106 can serve as a diffusion barrier, preventing the copper (or other metal) from diffusing into, or doping, the surrounding dielectric materials, which can degrade their properties. Silicon, for example, forms deep-level traps when doped with copper. An ideal barrier metal liner must limit copper diffusivity sufficiently to chemically isolate the copper conductor from the surrounding materials and should have a high electrical conductivity, for example, tantalum nitride and tantalum (TaN/Ta), titanium, titanium nitride, cobalt, ruthenium, and manganese. In some embodiments of the invention, the liner 106 is a multi-layer liner (e.g., a two-layer liner). In some embodiments of the invention, a first liner layer can act as a diffusion barrier and the second liner layer can act as a wetting layer that improves the gap-filling capabilities of subsequently deposited materials (i.e., the bulk conductor) while also improving electromigration. In some embodiments of the invention, the first liner layer includes TaN or Ta while the second liner layer includes Co or Ru.

Figure 2:
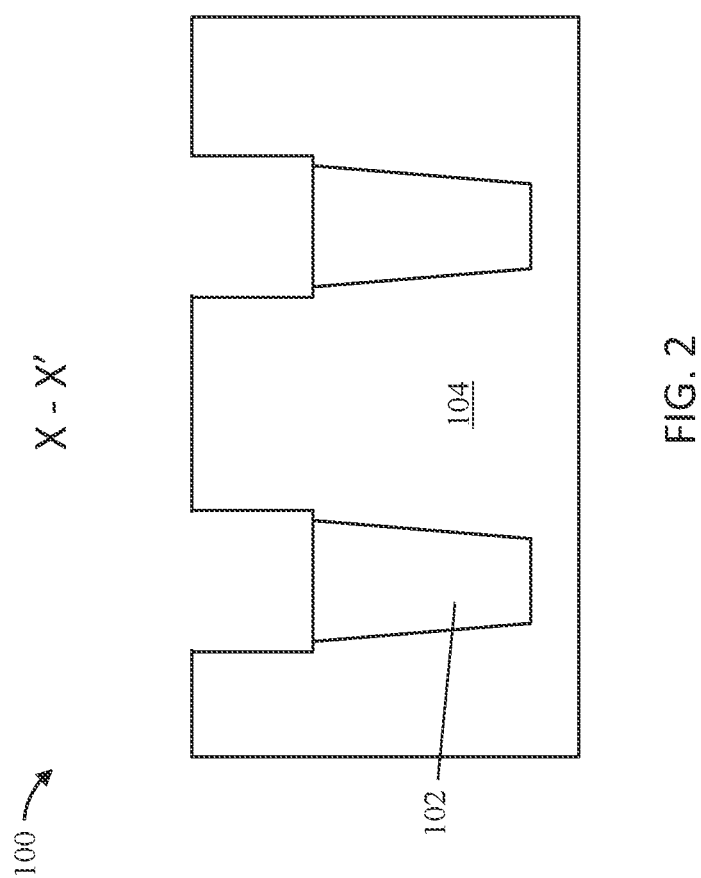
FIG. 2 depicts a cross-sectional view of a semiconductor structure along the line X-X' of FIG. 1 after one or more processing operations according to one or more embodiments of the invention.

FIG. 2 depicts a cross-sectional view of the interconnect structure 100 along the line X-X' of FIG. 1 after a processing operation according to one or more embodiments of the invention. In some embodiments of the invention, the conductive line 102 is recessed. The conductive line 102 can be recessed using a wet etch, a dry etch, or a combination of sequential wet and/or dry etches. In some embodiments of the invention, the conductive line 102 and the liner 106 (when present) are concurrently or sequentially recessed.

Figure 7:
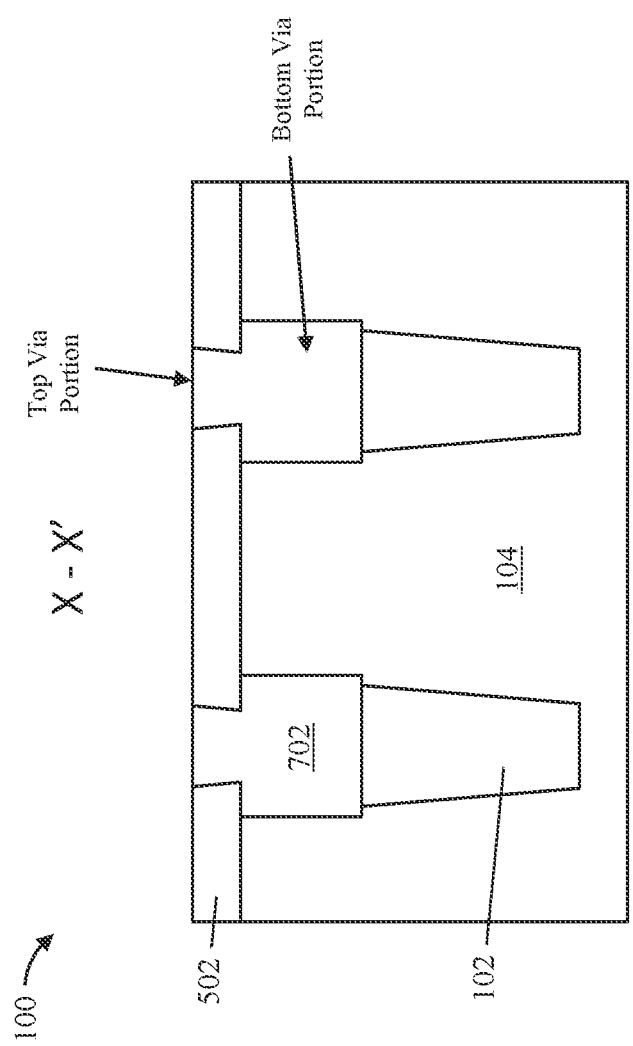
FIG. 7 depicts a cross-sectional view of a semiconductor structure along the line X-X' of FIG. 1 after one or more processing operations according to one or more embodiments of the invention.

In some embodiments of the invention, the conductive line 102 is recessed from the topmost surface of the dielectric layer 104. In some embodiments of the invention, the conductive line 102 is recessed using a wet etchant selective to the dielectric layer 104. In some embodiments of the invention, the conductive line 102 is recessed 1 to 10 nm, although other recess depths are within the contemplated scope of the invention. As shown in FIG. 7, the depth to which the conductive line 102 is recessed will define the final height of the bottom, relatively wide portion of the stepped via 702.

Figure 3:
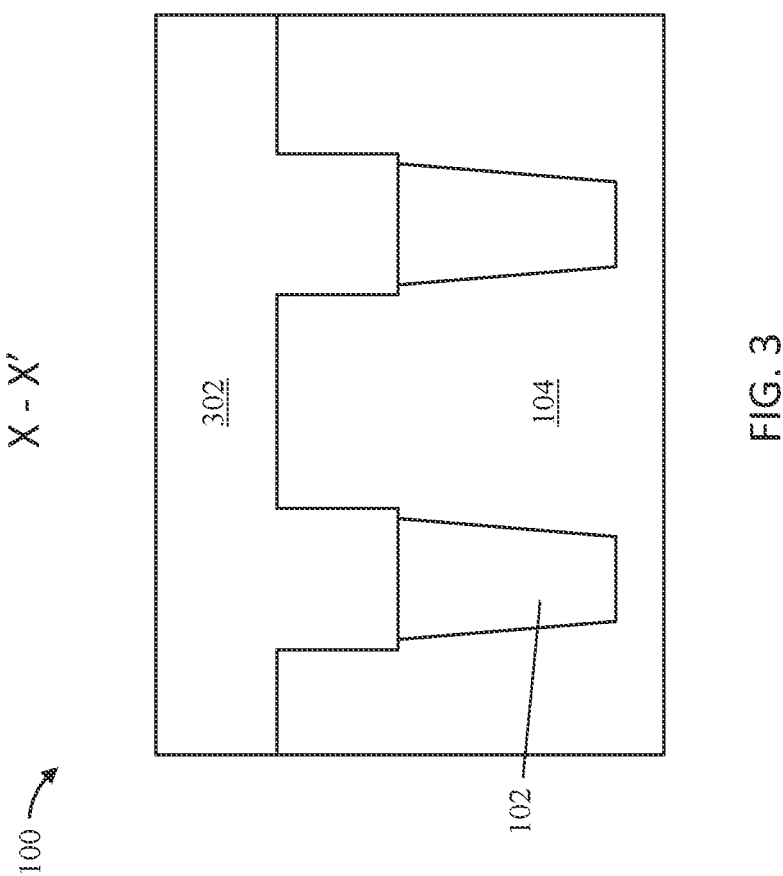
FIG. 3 depicts a cross-sectional view of a semiconductor structure along the line X-X' of FIG. 1 after one or more processing operations according to one or more embodiments of the invention.

FIG. 3 depicts a cross-sectional view of the interconnect structure 100 along the line X-X' of FIG. 1 after a processing operation according to one or more embodiments of the invention. In some embodiments of the invention, a second dielectric layer 302 is deposited or formed on the recessed surface of the conductive line 102. In some embodiments of the invention, the second dielectric layer 302 is bulk deposited over the interconnect structure 100, forming an overburden on the conductive line 102 and the dielectric layer 104. The second dielectric layer 302 can be formed or deposited using, for example, CVD, PECVD, ALD, flowable CVD, spin-on dielectrics, or PVD. The second dielectric layer 302 can be deposited to any suitable thickness. In some embodiments of the invention, the second dielectric layer 302 is deposited to a height of about 50 nm above a surface of the dielectric layer 104, although other heights are within the contemplated scope of the invention.

The second dielectric layer 302 can be made of any suitable dielectric material, such as, for example, low-k dielectrics (materials having a small dielectric constant relative to silicon dioxide, i.e., less than about 3.9), ultra-low-k dielectrics (materials having a dielectric constant less than 3), porous silicates, carbon doped oxides, silicon dioxides, silicon nitrides, silicon oxynitrides, silicon carbide (SiC), or other dielectric materials. In some embodiments of the invention, dielectric material for the second dielectric layer 302 is selected to provide etch selectivity with respect to the dielectric layer 104. In this manner, the second dielectric layer 302 can be removed selective to the dielectric layer 104 (as shown FIG. 6).

Figure 4:
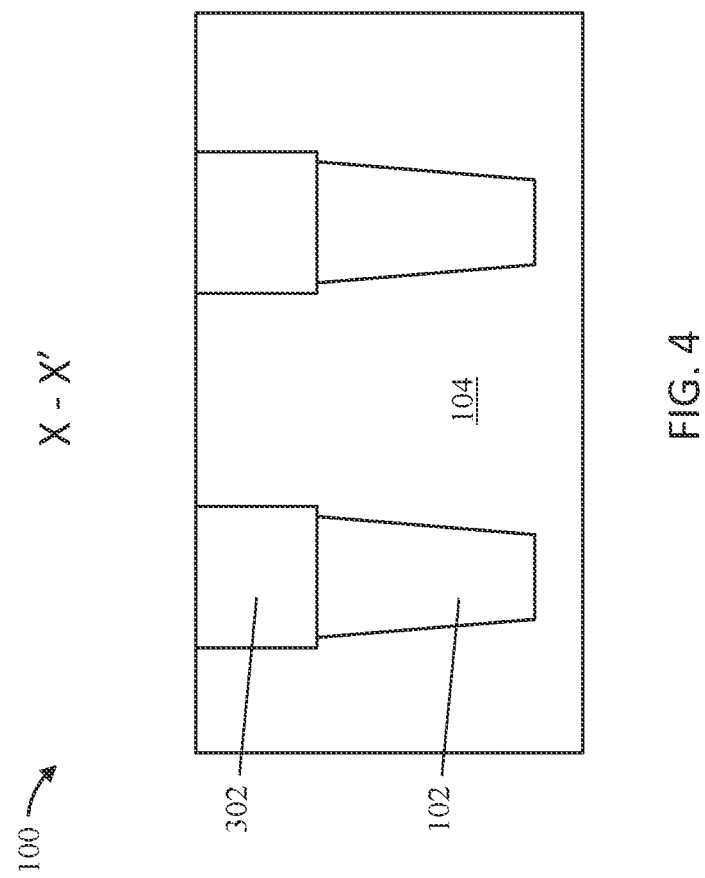
FIG. 4 depicts a cross-sectional view of a semiconductor structure along the line X-X' of FIG. 1 after one or more processing operations according to one or more embodiments of the invention.

FIG. 4 depicts a cross-sectional view of the interconnect structure 100 along the line X-X' of FIG. 1 after a processing operation according to one or more embodiments of the invention. In some embodiments of the invention, the second dielectric layer 302 is planarized using, for example, a dielectric CMP. In some embodiments of the invention, the second dielectric layer 302 is planarized to a surface of the dielectric layer 104.

Figure 5:
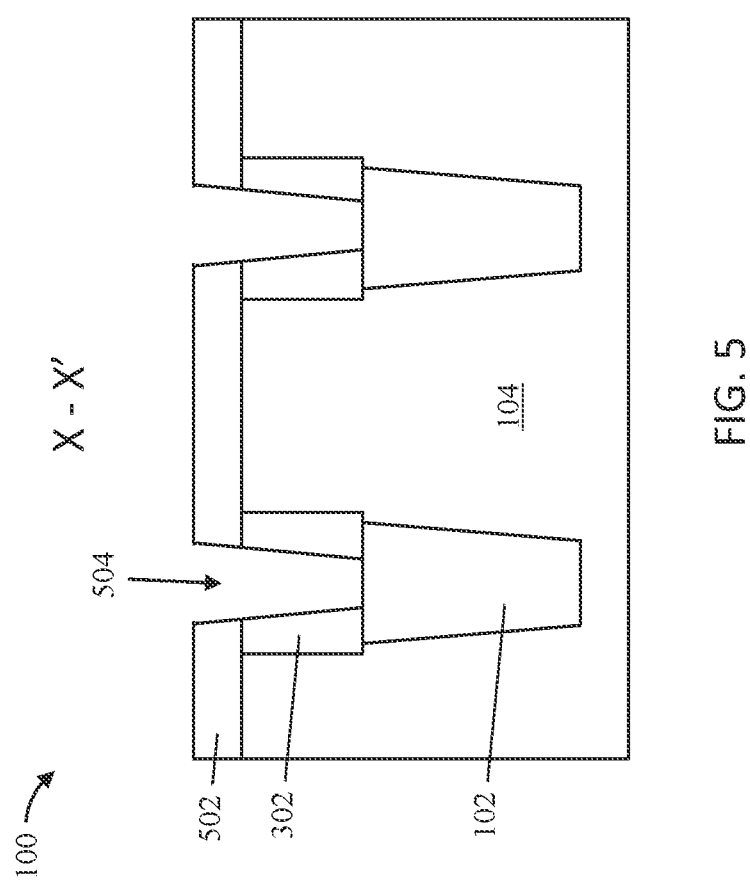
FIG. 5 depicts a cross-sectional view of a semiconductor structure along the line X-X' of FIG. 1 after one or more processing operations according to one or more embodiments of the invention.

FIG. 5 depicts a cross-sectional view of the interconnect structure 100 along the line X-X' of FIG. 1 after a processing operation according to one or more embodiments of the invention. In some embodiments of the invention, an etch stop layer 502 is formed over the dielectric layer 104 and the second dielectric layer 302. In some embodiments of the invention, the etch stop layer 502 is a high-k dielectric film formed directly on a surface of the dielectric layer 104 and the second dielectric layer 302. As used herein, high-k materials are those having a large dielectric constant relative to silicon dioxide, i.e., more than about 3.9).

The high-k dielectric film can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum.

In some embodiments of the invention, the etch stop layer 502 can be formed or deposited to a thickness of about 0.5 nm to about 25 nm, for example 10 nm, although other thicknesses are within the contemplated scope of the invention. In some embodiments of the invention, the etch stop layer 502 includes aluminum oxide and has a thickness of about 5 nm. As shown in FIG. 7, the thickness of the etch stop layer 502 will define the final height of the top, relatively narrow portion of the stepped via 702.

In some embodiments of the invention, portions of the etch stop layer 502 and portions of the second dielectric layer 302 are removed (patterned) to form a recess 504 that exposes a surface of the conductive line 102 and sidewalls of the second dielectric layer 302. The etch stop layer 502 and the second dielectric layer 302 can be patterned using a wet etch, a dry etch, or a combination of sequential wet and/or dry etches. In some embodiments of the invention, portions of the etch stop layer 502 and the second dielectric layer 302 are removed selective to the conductive line 102. For example, dielectric material can be removed selective to a metal using reactive ion etching (RIE).

Figure 6:
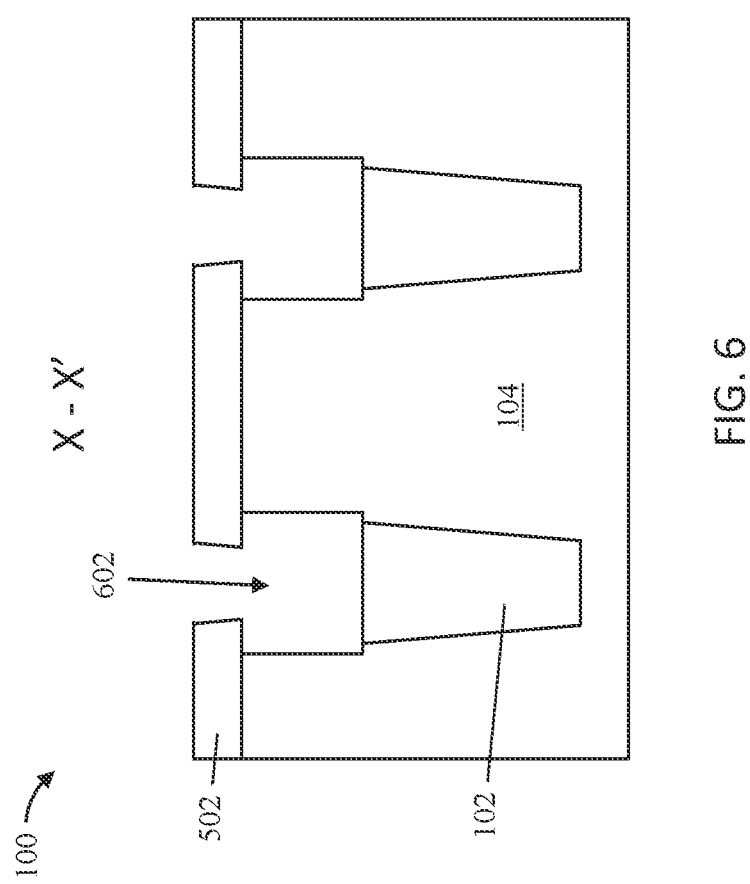
FIG. 6 depicts a cross-sectional view of a semiconductor structure along the line X-X' of FIG. 1 after one or more processing operations according to one or more embodiments of the invention.

FIG. 6 depicts a cross-sectional view of the interconnect structure 100 along the line X-X' of FIG. 1 after a processing operation according to one or more embodiments of the invention. In some embodiments of the invention, portions of the second dielectric layer 302 are removed to define an enlarged cavity 602 that exposes sidewalls of the dielectric layer 104. As shown in FIG. 6, in some embodiments of the invention, the enlarged cavity 602 undercuts the etch stop layer 502. In this manner the enlarged cavity 602 can have a bottom, relatively wide portion below the bottommost surface of the etch stop layer 502, and a top, relatively narrow portion confined between sidewalls of the etch stop layer 502. In other words, the top, narrow portion of the enlarged cavity 602 can be wholly or partially centered over the bottom, relatively wide portion of the enlarged cavity 602 (i.e., truly centered over the enlarged cavity 602 or positioned within the outermost perimeter of the enlarged cavity 602).

Figure 8:
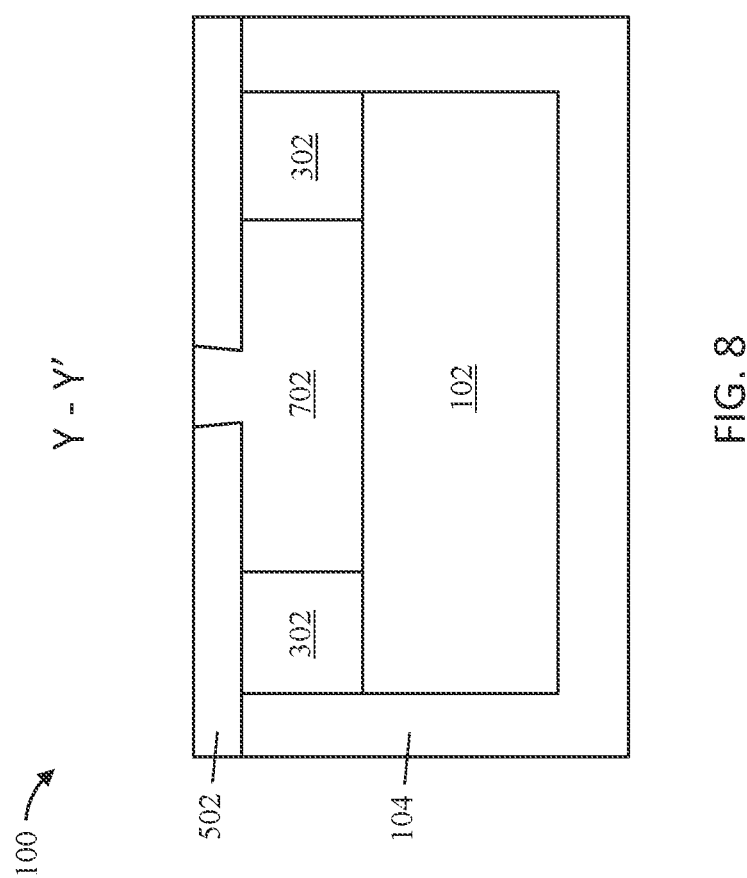
FIG. 8 depicts a cross-sectional view of a semiconductor structure along the line Y-Y' of FIG. 1 after one or more processing operations according to one or more embodiments of the invention.

The second dielectric layer 302 can be removed using a wet etch, a dry etch, or a combination of sequential wet and/or dry etches. In some embodiments of the invention, the second dielectric layer 302 is removed selective to the dielectric layer 104. For example, nitrides can be removed selective to oxides using hydrofluorocarbon-based etchants. In some embodiments of the invention, the second dielectric layer 302 is removed using a lateral etch selective to the dielectric layer 104. In some embodiments of the invention, the degree to which the second dielectric layer 302 is laterally etched is increased or decreased by adjusting a duration of the lateral etch. In other words, the second dielectric layer 302 can be wholly or partially removed from the conductive line 102 (see FIG. 8 illustrating a partial lateral etch of the second dielectric layer 302 whereby the bottom portion of a stepped via does not fully extend along the conductive line).

FIG. 7 depicts a cross-sectional view of the interconnect structure 100 along the line X-X' of FIG. 1 after a processing operation according to one or more embodiments of the invention. In some embodiments of the invention, a stepped via 702 is formed in the enlarged cavity 602.

In some embodiments of the invention, the stepped via 702 can be formed from materials that include copper or a non-copper metal (e.g., tungsten, titanium, tantalum, ruthenium, zirconium, cobalt, aluminum, platinum), alloys thereof, conducting metallic compound material (e.g., tantalum nitride, titanium nitride, tantalum carbide, titanium carbide, titanium aluminum carbide, tungsten silicide, tungsten nitride, cobalt silicide, nickel silicide), conductive carbon, or any suitable combination of these materials. In some embodiments of the invention, the stepped via 702 is formed from a same material as the conductive line 102. For example, the stepped via 702 and the conductive line 102 can be made cobalt or ruthenium.

After forming the stepped via 702, the process flow can continue using known BEOL fabrication techniques. While only a single "M" layer (e.g., the conductive line 102) and a single "V" layer (e.g., the stepped via 702) of the interconnect structure 100 are shown for ease of illustration, it is understood that the interconnect structure 100 can include any number of "M" layers and any number of "V" layers. Each of these "M" layers can be separated from the next "V" layer (the via layer above) by a stepped via formed in a similar manner as the stepped via 702.

In other words, after forming the stepped via 702, one or more additional "M" layers alternating with one or more additional "V" layers can be formed over the interconnect structure 100 using conventional BEOL processes. For example, if the conductive line 102 defines a first "M" layer (i.e., an M1 layer), a second "M" layer (i.e., an M2 layer) can be formed over the "V1" layer (i.e., the stepped via 702). Similarly, if the stepped via 702 defines a first "V" layer (i.e., a V1 layer), a second "V" layer (i.e., a V2 layer) can be formed over the "M2" layer. In this manner, any number of alternating "M" layers and "V" layers can be formed over a substrate. In some embodiments of the invention, each of the "M" layers are electrically coupled to other "M" layers (below or above) through one or more of the "V" layer vias (which can include conventional vias as well as stepped vias formed according to one or more embodiments of the present invention). For example, one of the conductive lines in the Mn+1 layer can be in electrical contact with the stepped via 702.

FIG. 8 depicts a cross-sectional view of the interconnect structure 100 along the line Y-Y' of FIG. 1 after forming the stepped via 702 according to one or more embodiments of the invention. As discussed previously herein, the degree to which the stepped via 702 extends over the conductive line 102 is controlled by the duration of the lateral etch of the second dielectric layer 302. In some embodiments of the invention, the second dielectric layer 302 is partially removed from the conductive line 102, resulting in the stepped via 702 partially extending over the conductive line 102 (as shown in FIG. 8). In some embodiments of the invention, the second dielectric layer 302 is wholly removed from the conductive line 102, resulting in the stepped via 702 extending over the entirety of the conductive line 102 (not shown).

Figure 9:
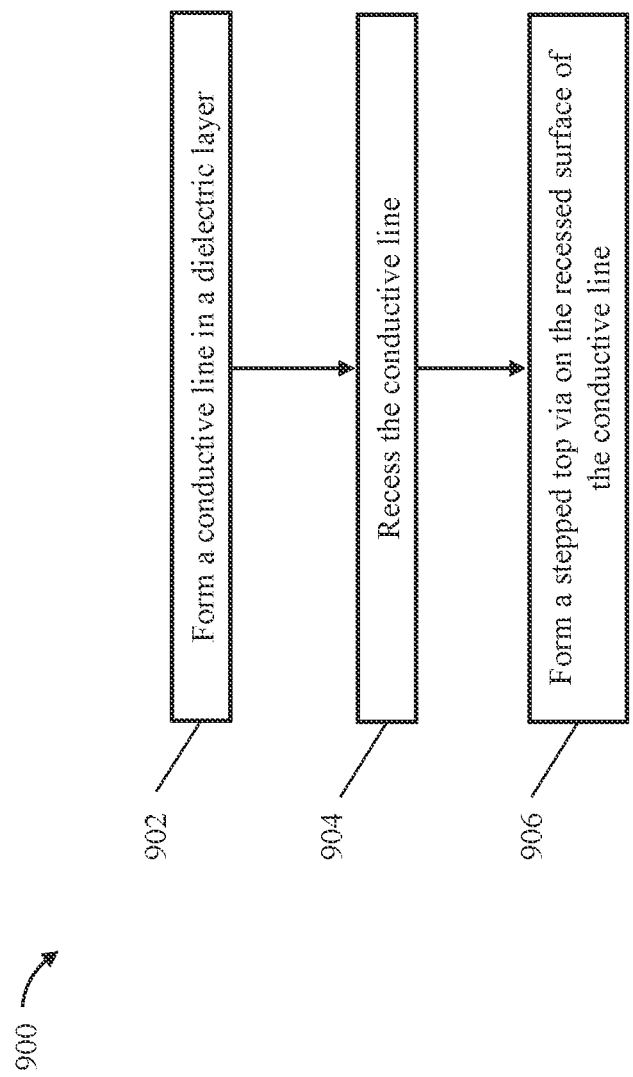
FIG. 9 depicts a flow diagram illustrating a method according to one or more embodiments of the invention.

FIG. 9 depicts a flow diagram 900 illustrating a method for forming a stepped top via in a metallization region of an integrated circuit according to one or more embodiments of the invention. As shown at block 902, a conductive line is formed in a dielectric layer. At block 904, the conductive line is recessed.

At block 906, a stepped top via is formed on the recessed surface of the conductive line. In some embodiments of the invention, the stepped top via includes a top portion having a first width and a bottom portion having a second width. In some embodiments of the invention, the second width is greater than the first width.

The method can include forming an etch stop layer on the dielectric layer. In some embodiments of the invention, the etch stop layer is opened to define the first width. The method can include forming a second dielectric layer in a cavity on the recessed surface of the conductive line. In some embodiments of the invention, the second dielectric layer is removed to define the second width. In some embodiments of the invention, removing the second dielectric layer includes laterally etching exposed sidewalls of the second dielectric layer.

Figure 10:
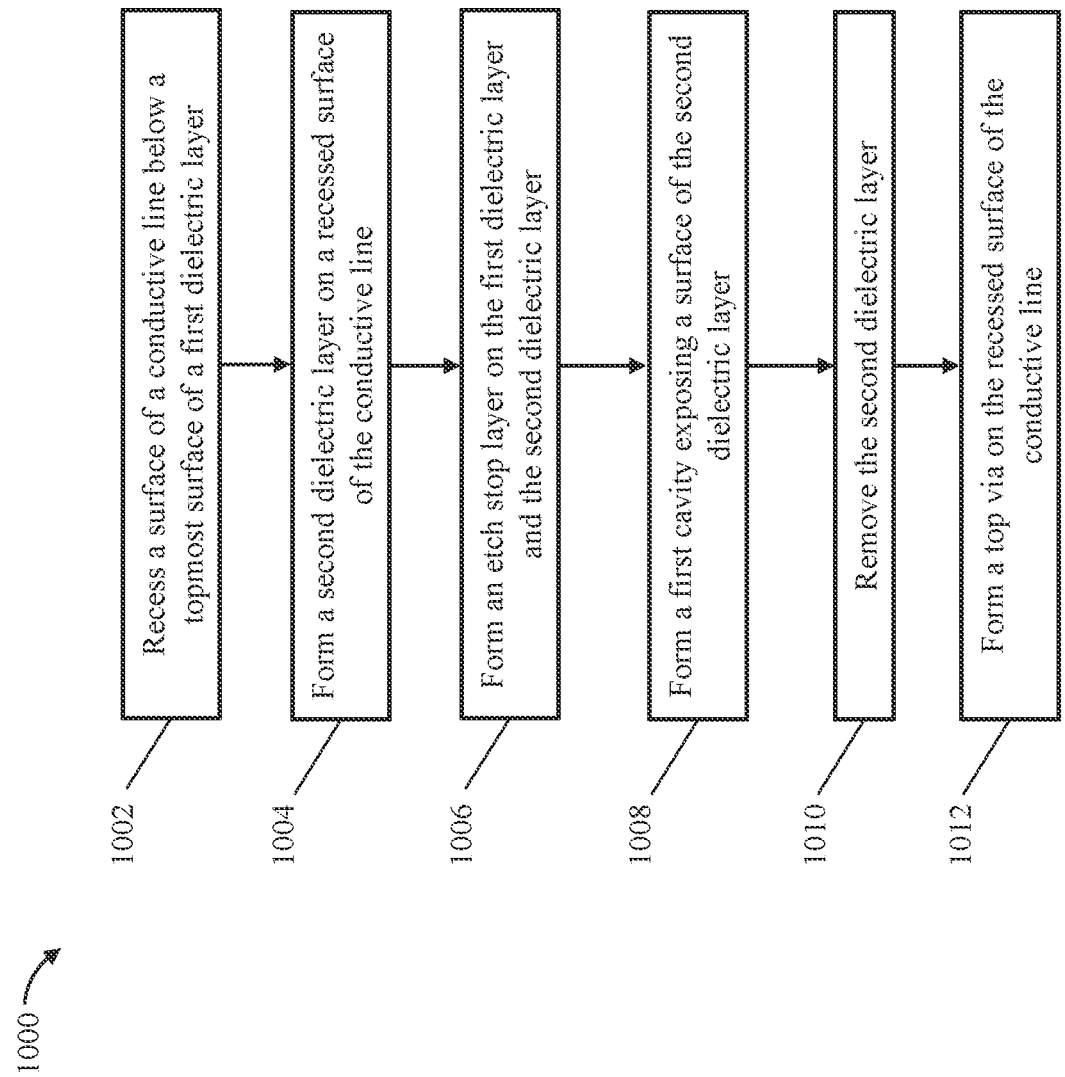
FIG. 10 depicts a flow diagram illustrating a method according to one or more embodiments of the invention.

FIG. 10 depicts a flow diagram 1000 illustrating a method for forming a stepped top via in a metallization region of an integrated circuit according to one or more embodiments of the invention. As shown at block 1002, a surface of a conductive line is recessed below a topmost surface of a first dielectric layer. At block 1004, a second dielectric layer is formed on a recessed surface of the conductive line.

At block 1006, an etch stop layer is formed on the first dielectric layer and the second dielectric layer. In some embodiments of the invention, sidewalls of the top portion of the top via are aligned to an opening in the etch stop layer. In some embodiments of the invention, the dielectric material includes a high-k material having a dielectric constant of at least 3.9.

At block 1008, a first cavity exposing a surface of the second dielectric layer is formed. The first cavity includes a first width as measured between sidewalls of the etch stop layer. In some embodiments of the invention, the first cavity exposes the recessed surface of the conductive line and sidewalls of the second dielectric layer (i.e., the first cavity punches through the etch stop layer to the conductive line). In some embodiments of the invention, the first cavity removes a portion of the etch stop layer, exposing a top surface and/or sidewalls of the second dielectric layer (i.e., the first cavity punches through the etch stop layer but does not fully extend to the conductive line).

At block 1010, the second dielectric layer is removed to define a second cavity having a second width greater than the first width. In some embodiments of the invention, removing the second dielectric layer includes laterally etching the exposed sidewalls of the second dielectric layer. In some embodiments of the invention, laterally etching the exposed sidewalls of the second dielectric layer undercuts the etch stop layer. In some embodiments of the invention, a material of the second dielectric layer is selected such that the second dielectric layer can be removed selective to the first dielectric layer. In some embodiments of the invention, forming the second dielectric layer includes depositing a dielectric material over the conductive line and the first dielectric layer and planarizing the dielectric material to a surface of the first dielectric layer.

At block 1012, a top via is formed on the recessed surface of the conductive line. The top via having a top portion in the first cavity and a bottom portion in the second cavity. In some embodiments of the invention, the top via is selectively formed on the recessed surface of the conductive line. In some embodiments of the invention, the top via includes a stepped top via. In some embodiments of the invention, the top portion includes the first width and the bottom portion includes the second width.

The method can further include reflowing the top via within the first cavity and the second cavity to remove or reduce a number of voids in the cavities. In some embodiments of the invention, reflowing is performed at a temperature of about 400 degrees Celsius, although other reflow temperatures are within the contemplated scope of the invention.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer or a conformal deposition) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and may or may not deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (ME), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. An integrated circuit comprising:
   a conductive line in a dielectric layer;
   a stepped top via on a surface of the conductive line, the stepped top via comprising a top portion having a first width and a bottom portion having a second width greater than the first width; and
   an etch stop layer on the dielectric layer, the etch stop layer in direct contact with a top surface of the bottom portion of the stepped top via and a sidewall of the top portion of the stepped top via.

2. The integrated circuit of claim 1, wherein sidewalls of the top portion are aligned to an opening in the etch stop layer.

3. The integrated circuit of claim 2, wherein the top portion is centered over the bottom portion.

4. The integrated circuit of claim 3, wherein the conductive line is recessed from a top surface of the dielectric layer.

5. The integrated circuit of claim 4 further comprising a second dielectric layer on the recessed surface of the conductive line, the second dielectric layer comprising a material selected such that the second dielectric layer can be removed selective to the dielectric layer.

6. The integrated circuit of claim 5, wherein a sidewall of the second dielectric layer is in direct contact with sidewalls of the bottom portion of the stepped top via.

7. The integrated circuit of claim 6, wherein a portion of the etch stop layer is in direct contact with a top surface of the second dielectric layer.

* * * * *